(12) United States Patent
Kim et al.

(10) Patent No.: US 11,699,721 B2
(45) Date of Patent: Jul. 11, 2023

(54) INTEGRATE-AND-FIRE NEURON CIRCUIT USING SINGLE-GATED FEEDBACK FIELD-EFFECT TRANSISTOR

(71) Applicant: Korea University Research and Business Foundation, Seoul (KR)

(72) Inventors: Sang Sig Kim, Seoul (KR); Kyoung Ah Cho, Seoul (KR); Sol A Woo, Gwacheon-si (KR); Doo Hyeok Lim, Seoul (KR); Jin Sun Cho, Seoul (KR); Young Soo Park, Seoul (KR)

(73) Assignee: Korea University Research and Business Foundation, Seoul (KR)

(*) Notice: Subject to any disclaimer, the term of this patent is extended or adjusted under 35 U.S.C. 154(b) by 905 days.

(21) Appl. No.: 16/686,406

(22) Filed: Nov. 18, 2019

(65) Prior Publication Data

US 2021/0056398 A1    Feb. 25, 2021

(30) Foreign Application Priority Data

Aug. 22, 2019    (KR) .................. 10-2019-0103264

(51) Int. Cl.
*H03K 17/687* (2006.01)
*H01L 29/10* (2006.01)
*H01L 29/06* (2006.01)
*H01L 29/08* (2006.01)
(Continued)

(52) U.S. Cl.
CPC ...... *H01L 29/1033* (2013.01); *H01L 29/0657* (2013.01); *H01L 29/0847* (2013.01); *H01L 29/42392* (2013.01); *H01L 29/7391* (2013.01); *H03K 17/6871* (2013.01)

(58) Field of Classification Search
CPC ..... H03K 17/6871; G06N 3/049; B82Y 10/00
See application file for complete search history.

(56) References Cited

U.S. PATENT DOCUMENTS

2015/0006455 A1* 1/2015 Suri .................. G06N 3/065
706/32

FOREIGN PATENT DOCUMENTS

| KR | 10-2017-0138047 A | 12/2017 |
| KR | 10-2018-0127153 A | 11/2018 |
| KR | 10-2019-0000186 A | 1/2019 |

OTHER PUBLICATIONS

Cauwenberghs, Gert., "An Analog VLSI Recurrent Neural Network Learning a Continuous-Time Trajectory", *IEEE Transactions on Neural Networks*, vol. 7, No. 2, Mar. 1996 (pp. 346-361).

(Continued)

*Primary Examiner* — Metasebia T Retebo
(74) *Attorney, Agent, or Firm* — NSIP Law

(57) ABSTRACT

The present disclosure relates to a novel integrate-and-fire (IF) neuron circuit using a single-gated feedback field-effect transistor (FBFET) to realize small size and low power consumption. According to the present disclosure, the neuron circuit according to one embodiment may generate potential by charging current input from synapses through a capacitor. In this case, when the generated potential exceeds a threshold value, the neuron circuit may generate and output a spike voltage corresponding to the generated potential using a single-gated feedback field-effect transistor connected to the capacitor. Then, the neuron circuit may reset the generated spike voltage using transistors connected to the feedback field-effect transistor.

13 Claims, 14 Drawing Sheets

(51) Int. Cl.
*H01L 29/423* (2006.01)
*H01L 29/739* (2006.01)

(56) References Cited

OTHER PUBLICATIONS

Vardhana, M. et al., "Convolutional neural network for bio-medical image segmentation with hardware acceleration", *Cognitive Systems Research*, vol. 50, Aug. 2018 (pp. 10-14).

* cited by examiner

[FIG. 1A]
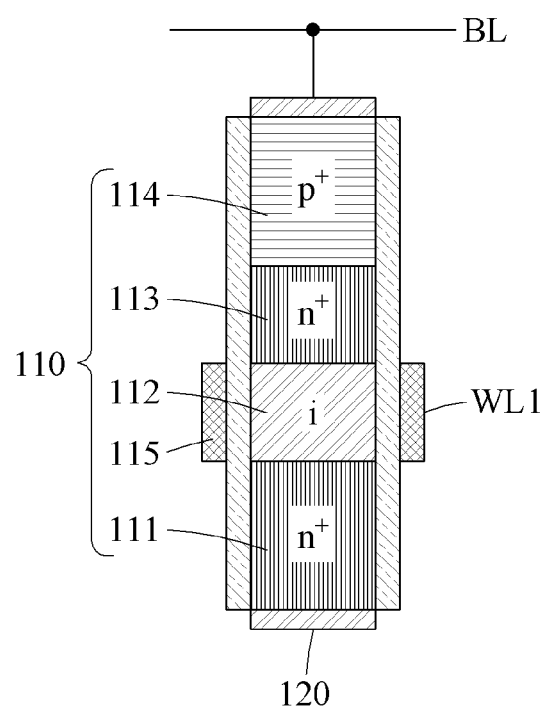

[FIG. 1B]
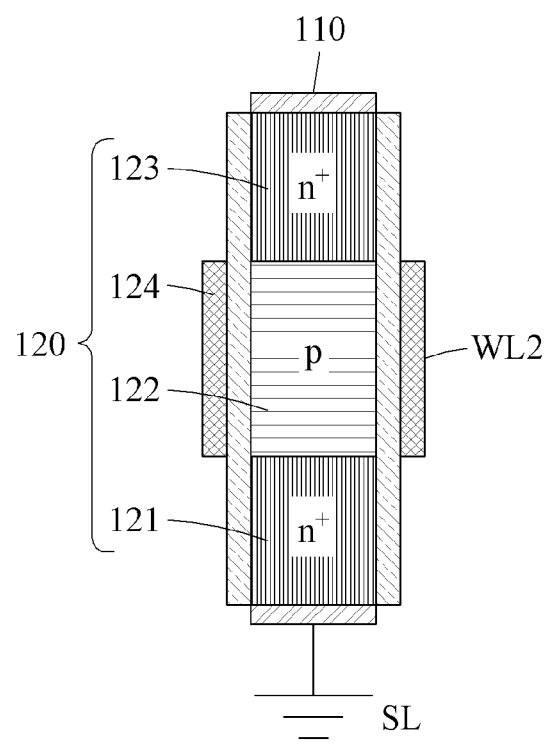

[FIG. 1C]
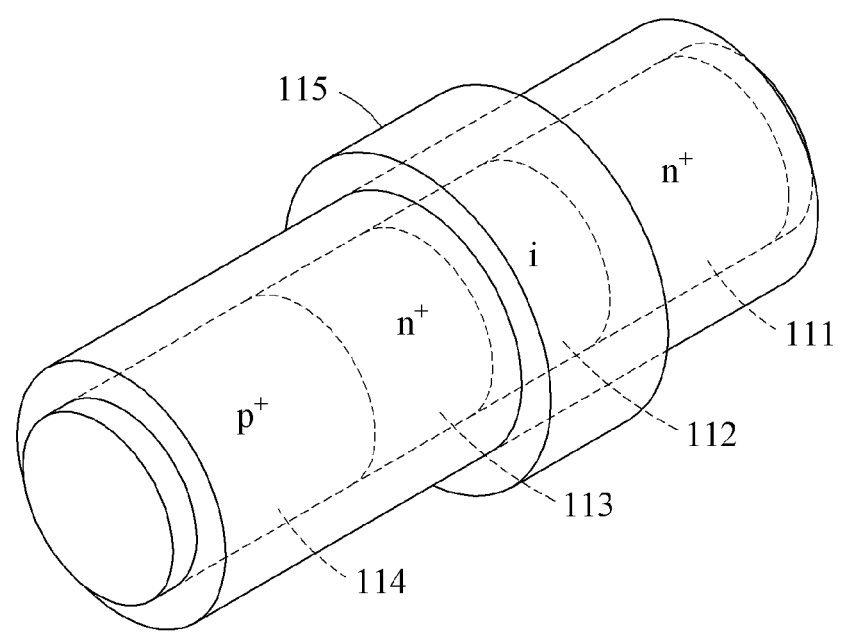

[FIG. 1D]
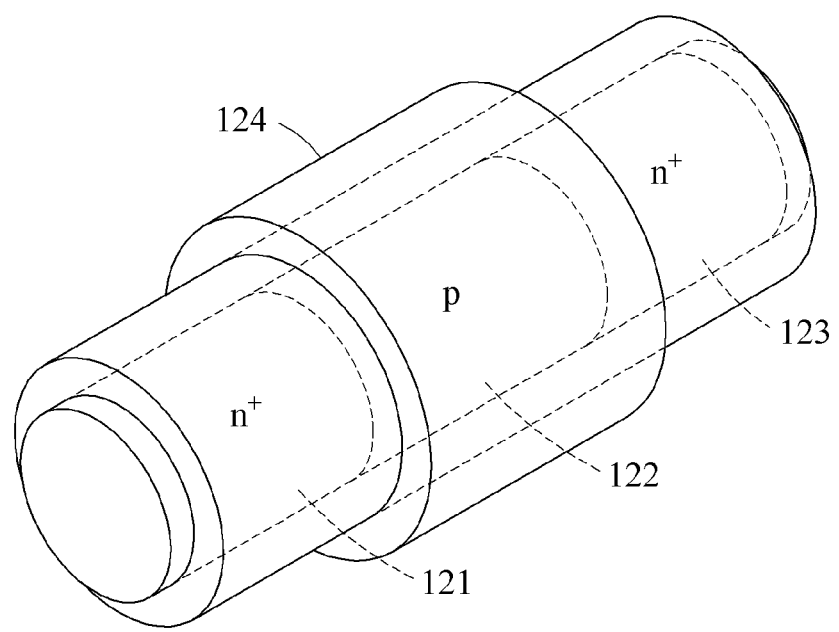

[FIG. 2]
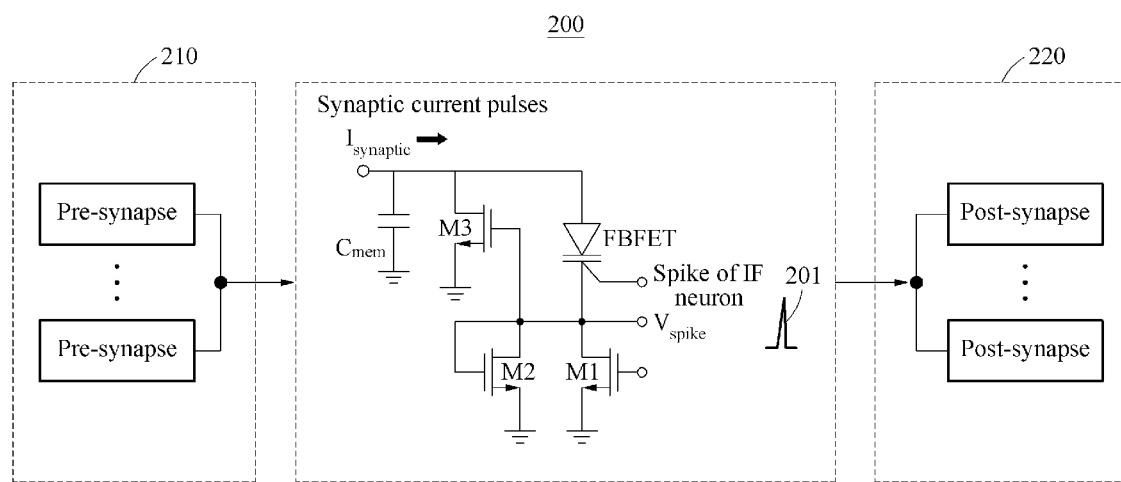

[FIG. 3A]
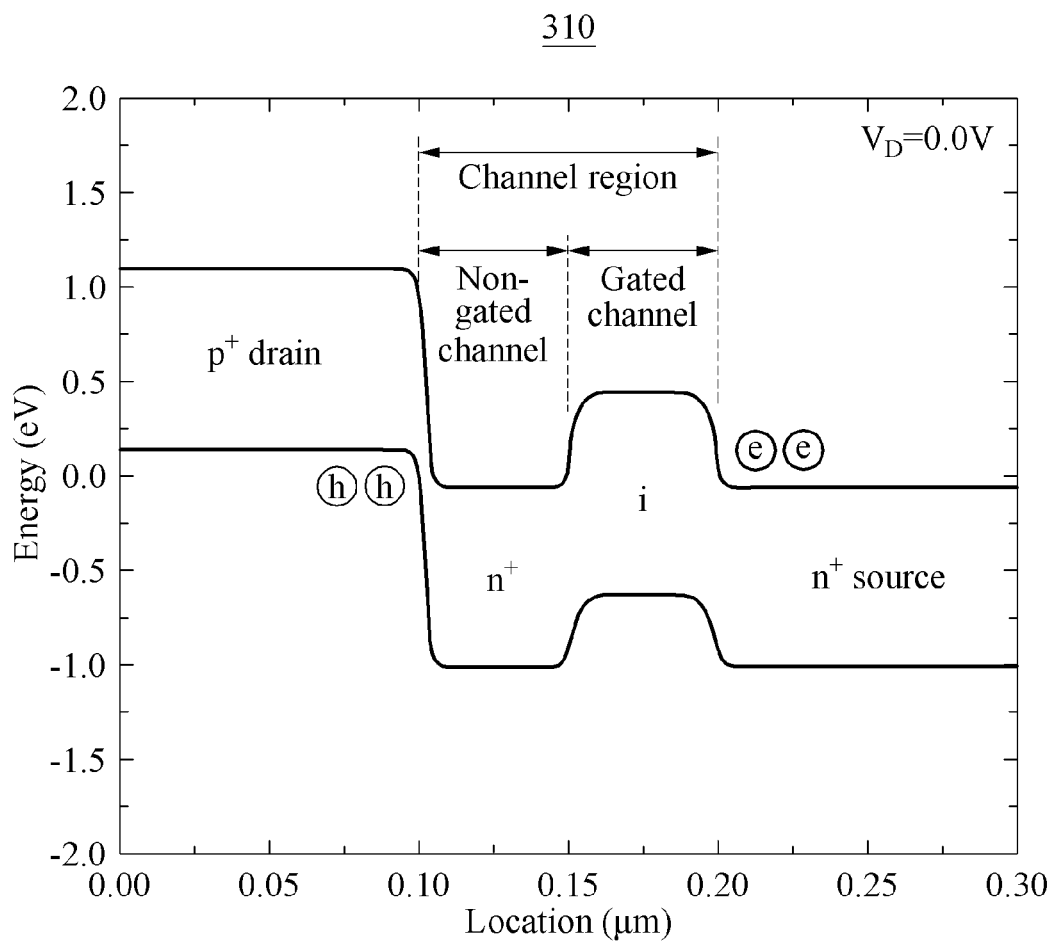

[FIG. 3B]
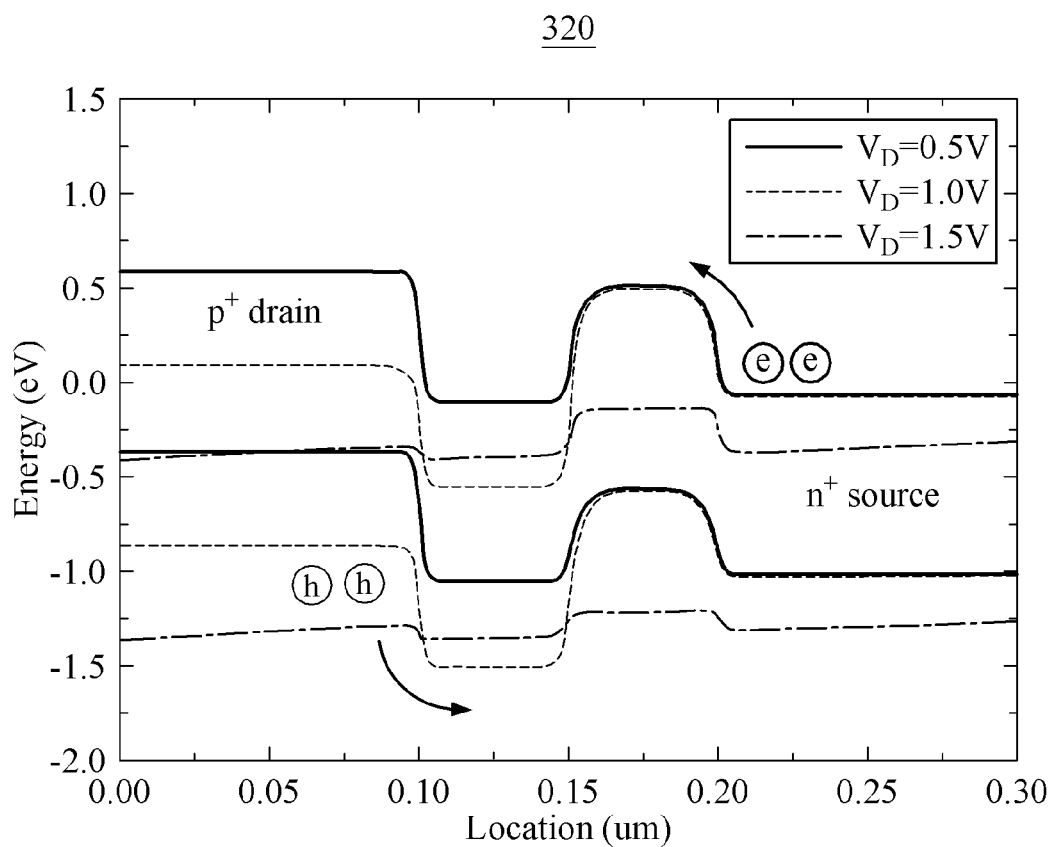

[FIG. 3C]
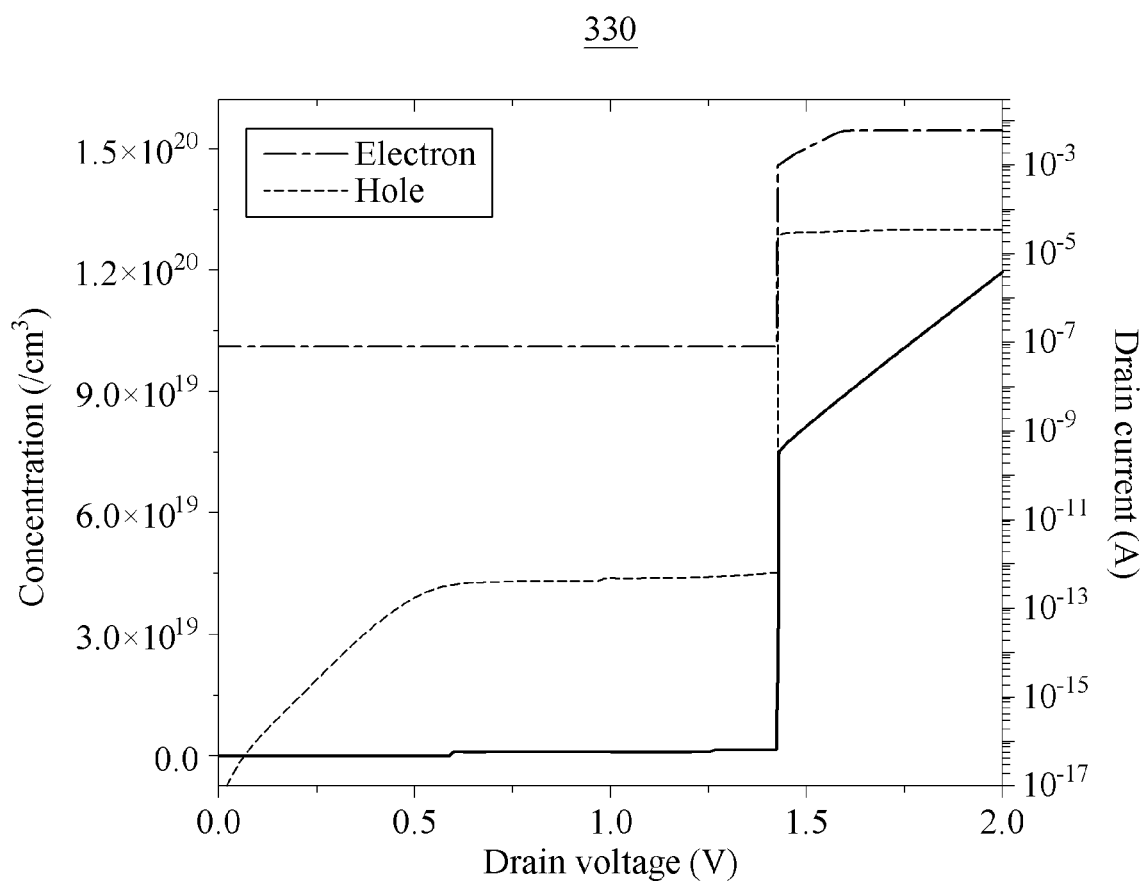

[FIG. 4A]
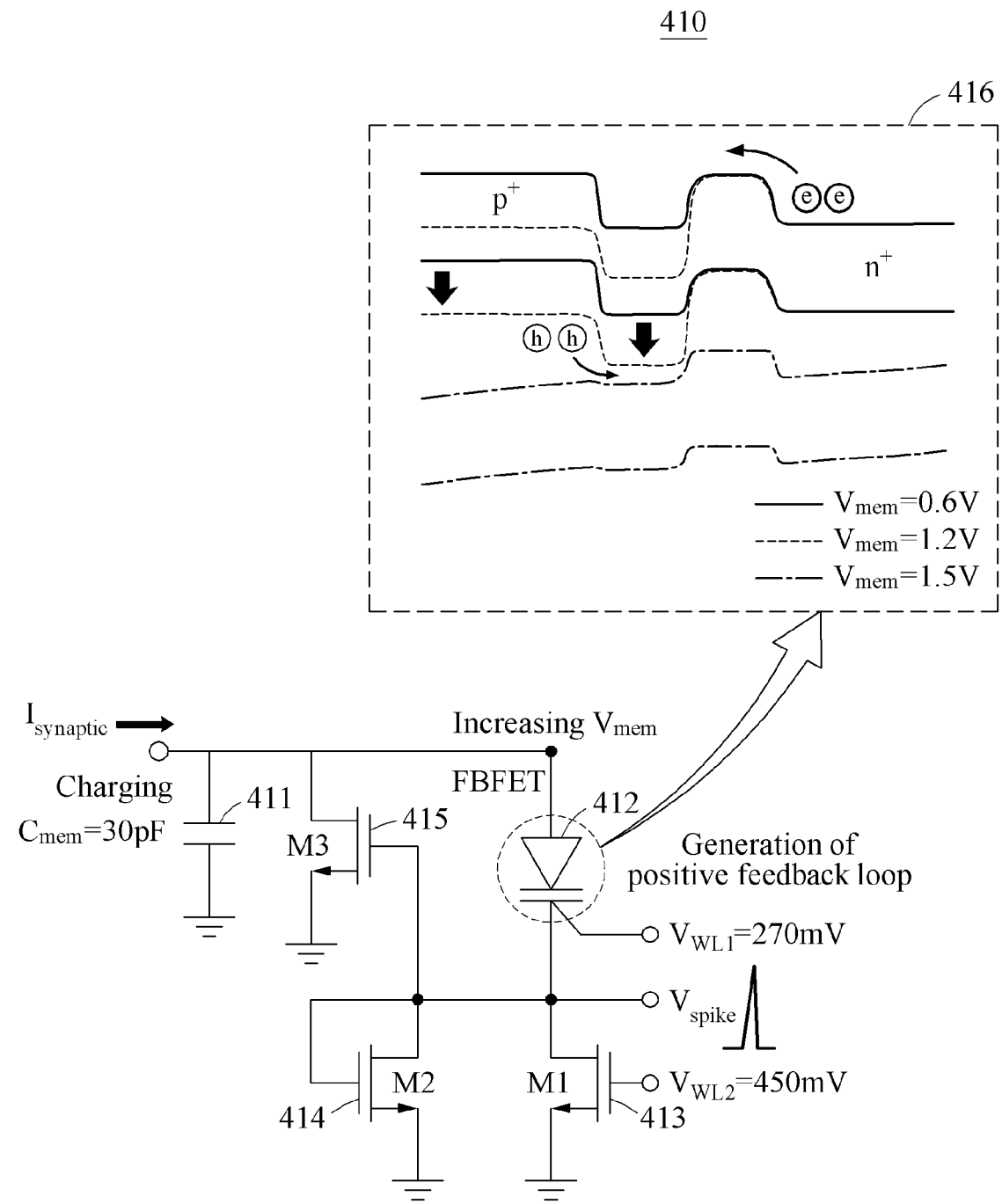

[FIG. 4B]
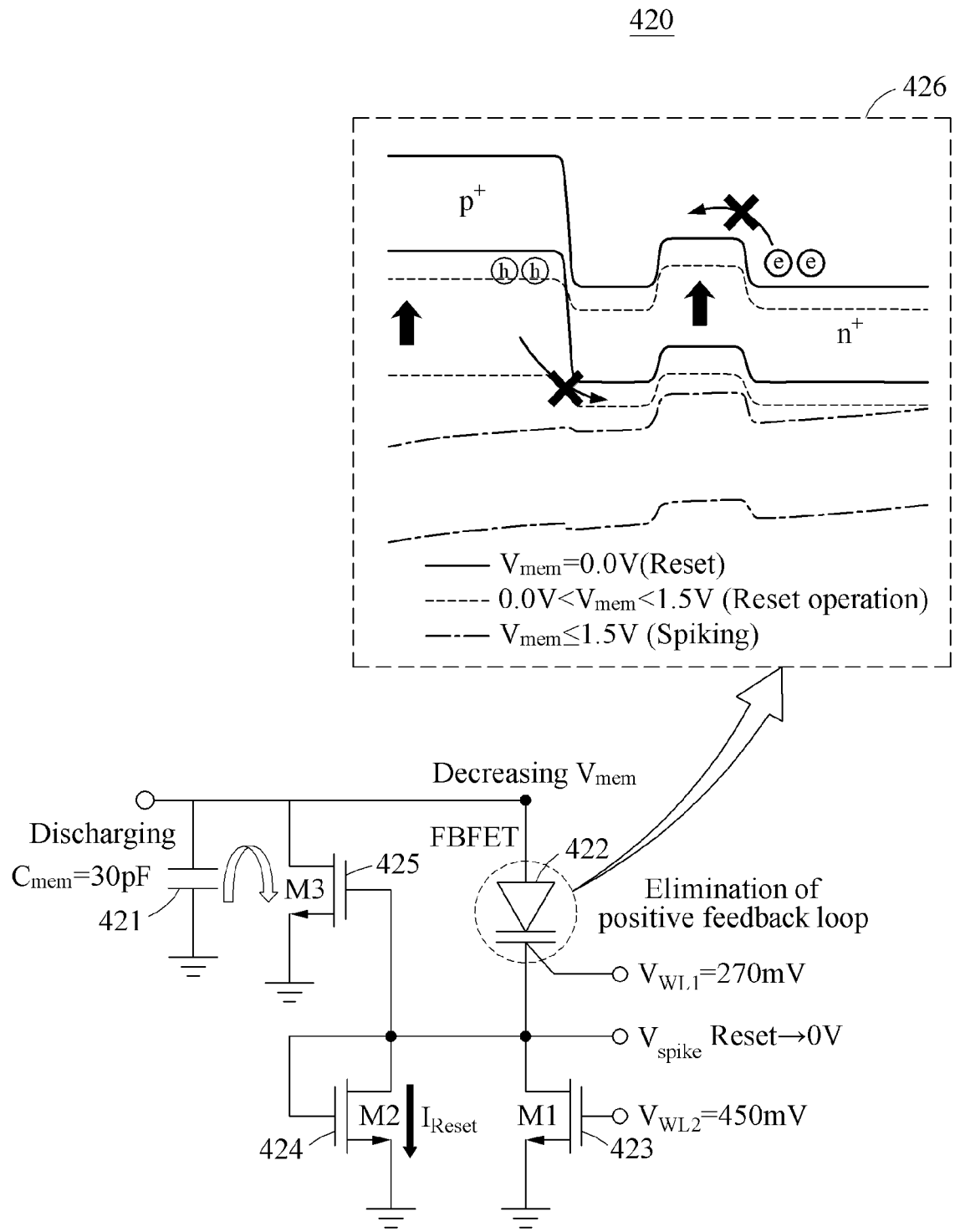

[FIG. 4C]
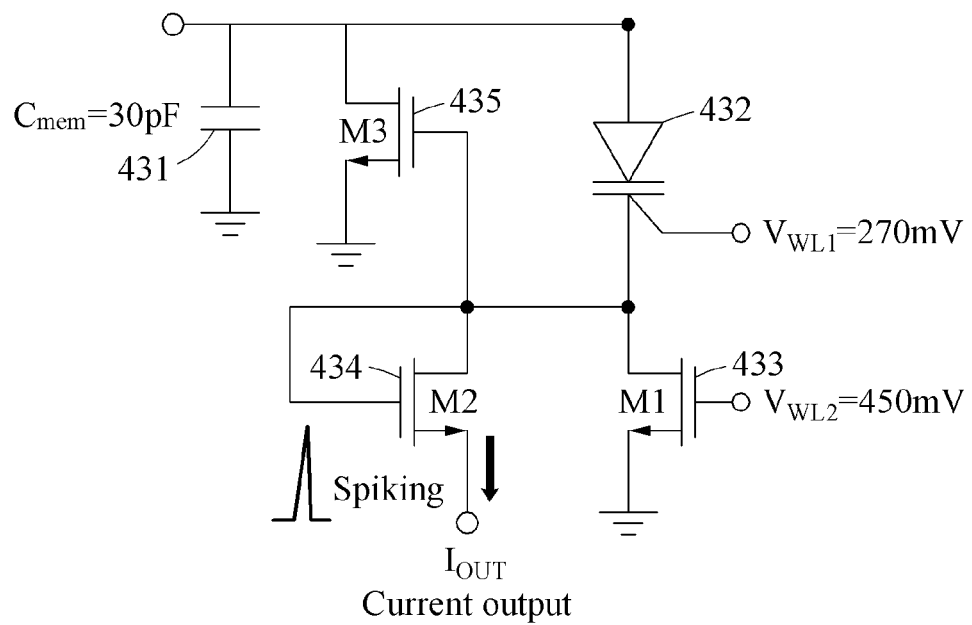

[FIG. 4D]
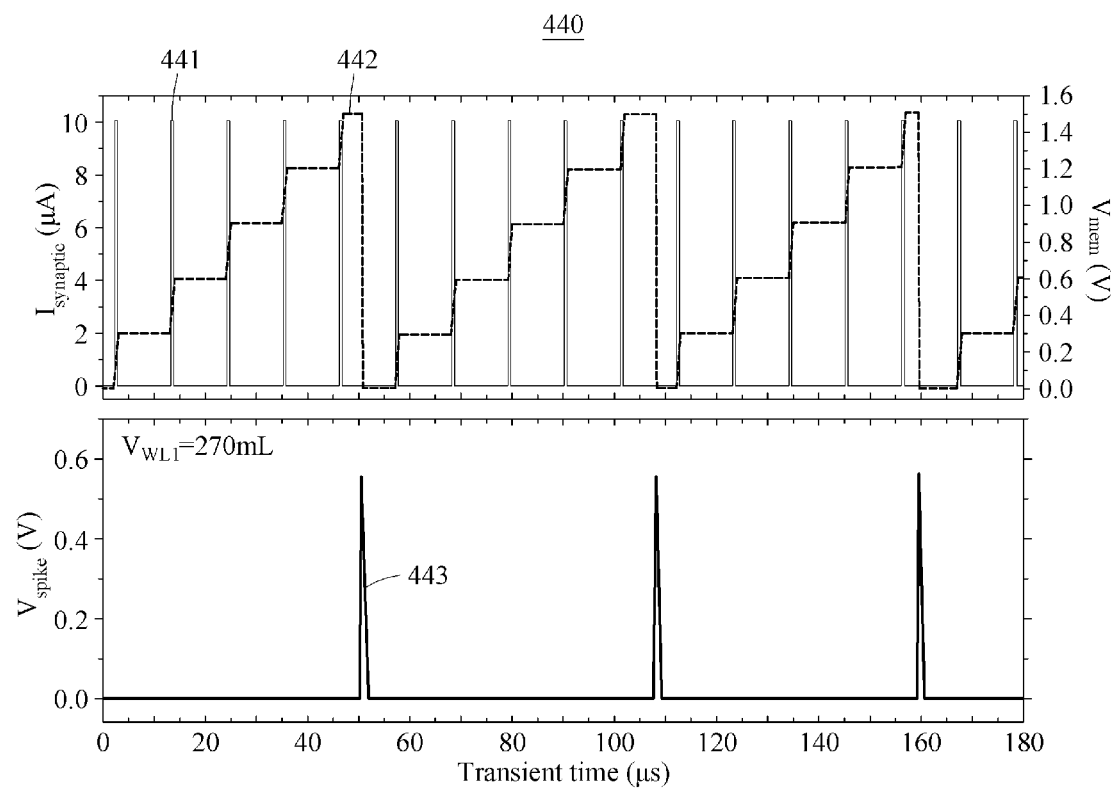

[FIG. 5A]
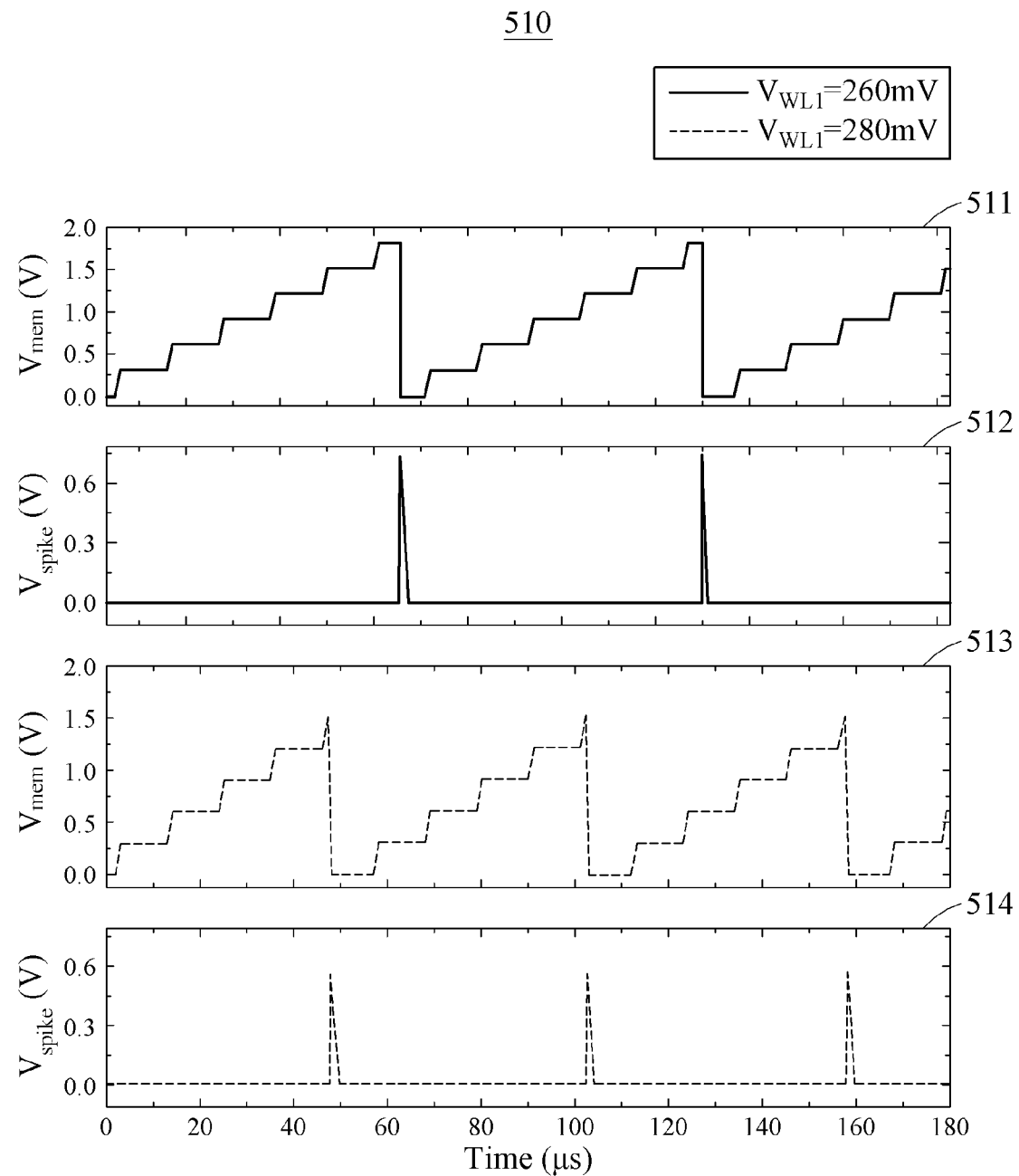

[FIG. 5B]
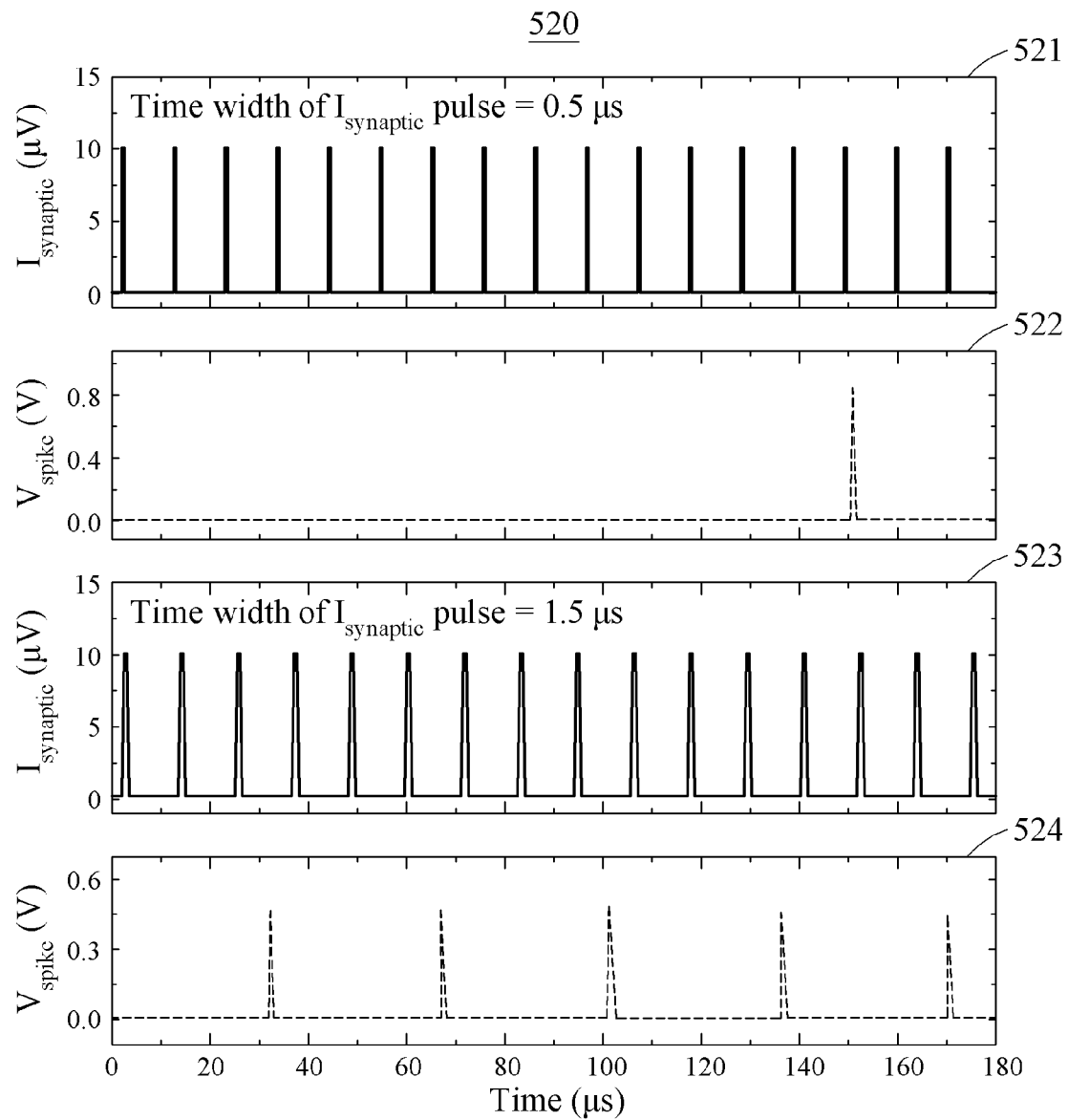

INTEGRATE-AND-FIRE NEURON CIRCUIT USING SINGLE-GATED FEEDBACK FIELD-EFFECT TRANSISTOR

CROSS-REFERENCE TO RELATED APPLICATION

This application claims priority to Korean Patent Application No. 10-2019-0103264, filed on Aug. 22, 2019 in the Korean Intellectual Property Office, the disclosure of which is incorporated herein by reference.

BACKGROUND OF THE DISCLOSURE

Field of the Disclosure

The present disclosure relates to a neuron circuit using a single-gated feedback field-effect transistor (FBFET). More particularly, the present disclosure relates to a novel integrate-and-fire (IF) neuron circuit using a single-gated feedback field-effect transistor to realize small size and low power consumption.

Description of the Related Art

Neuromorphic technology is a technology that imitates human nerve structures using electronic devices and circuits.

Conventional von Neumann-based computers have a fast operating speed in sequential mathematical calculations, but have limitations in terms of speed and power consumption in calculating simultaneous inputs and outputs.

As interest in artificial neural networks increases, development of electronic devices, such as a convolutional neural network (CNN), a recurrent neural network (RNN), and a spiking neural network (SNN), that imitate the neurons and brains of living organisms is accelerating.

Among various neuromorphic technologies, spiking neural network technology may be used to imitate the neural networks and brainwave action of the brain to implement more sophisticated thinking capabilities.

To imitate these spiking neural networks, neurons and synapses must be implemented as electronic devices. In particular, studies are being conducted around the world to implement synapses responsible for memory and learning as electronic devices.

Synapse-imitating devices require characteristics such as bidirectional parallel operation, synapse plasticity, low power, and high integration.

In the case of conventional memory devices, a bidirectional parallel operation may not be performed and implementation of synapse plasticity may be difficult. Accordingly, studies on memory devices made of various materials and having various structures, such as resistive random-access memory (ReRAM), phase change memory (PCM), and conductive bridge memory (CBRAM), have been conducted.

In particular, an SNN is regarded as the most powerful computational tool for evaluating complex pattern recognition, classification, and function due to high-speed and real-time operation and biological fidelity thereof.

Unlike deep neural network (DNN)-based technology, which is widely used, an SNN is a network that imitates the behavior of the human brain, and may send and receive electrical signals by controlling the strength of synaptic connections through interaction between neurons. Through this process, the SNN may process information.

In an SNN, neuron circuits generate a series of spikes to transmit information, and encode input signals to generate spikes. In addition, in an SNN, a number of neuron circuits are integrated and connected to neural microchips to process interconnected inputs and outputs.

Therefore, to construct a hardware-based SNN, designing an efficient neuron circuit that is small in size and low in power consumption is the most important consideration.

However, most recent studies have focused on the functions of neurons, which are required to implement input pulse integration, threshold triggering, and spike voltage. In particular, the studies focus on designing a CMOS-based circuit for these neuron functions. In addition, neuron circuits designed to implement these functions use a number of transistors with high power consumption.

Therefore, there is a need to develop a neuron circuit with small size and low power consumption.

RELATED ART DOCUMENTS

Patent Documents

Korean Patent Application Publication No. 2017-0138047 "NEURON-IMITATING DEVICE AND CIRCUIT"
Korean Patent Application Publication No. 2018-0127153 "NEURAL SYSTEM-IMITATING INTEGRATED CIRCUIT INCLUDING NEURON CIRCUIT AND SYNAPSE DEVICE ARRAY AND METHOD OF FABRICATING THE SAME"

Non-Patent Documents

M. Vardhana, N. Arunkumar, S. Lasrado, E. Abdulhay, and, G. Ramirez "Convolutional Neural Network for Biomedical Image Segmentation with Hardware Acceleration." Cognitive Systems, Vol. 50, pp. 10-14, August 2018, doi: 10.1016/j.cogsys.2018.03.005.
G. Cauwenberghs. "An Analog VLSI Recurrent Neural Network Learning a Continuous-time Trajectory." IEEE Transactions on Neural Networks, Vol. 7, no. 2, pp. 346-361, March 1996, doi: 10.1109/72.485671.

SUMMARY OF THE DISCLOSURE

Therefore, the present disclosure has been made in view of the above problems, and it is an object of the present disclosure to provide a novel integrate-and-fire (IF) neuron circuit using a single-gated feedback field-effect transistor (FBFET) to realize small size and low power consumption.

It is another object of the present disclosure to provide an integrate-and-fire (IF) neuron circuit capable of implementing a high fire frequency of 20 kHz and a low power consumption of 7 μW using only four transistors.

It is yet another object of the present disclosure to provide a possibility of realizing a hardware-based SNN for very-large-scale integration (VLSI).

In accordance with one aspect of the present disclosure, provided is a neuron circuit, wherein the neuron circuit generates potential by charging current input from synapses through a capacitor; when the generated potential exceeds a threshold value, the neuron circuit generates and outputs a spike voltage corresponding to the generated potential using a single-gated feedback field-effect transistor (FBFET) connected to the capacitor; and the neuron circuit resets the generated spike voltage using three transistors connected to the feedback field-effect transistor.

According to one embodiment, a drain electrode of the single-gated feedback field-effect transistor may be connected in parallel to the capacitor, a source electrode of the single-gated feedback field-effect transistor may be connected to the three transistors, and a gate electrode of the single-gated feedback field-effect transistor may be connected to a first word line.

According to one embodiment, among the three transistors, a gate electrode of a first transistor may be connected to a second word line, and a drain electrode of the first transistor may be connected in series to a source electrode of the feedback field-effect transistor; a gate electrode and drain electrode of a second transistor may be commonly connected to the drain electrode of the first transistor and the source electrode of the feedback field-effect transistor; and a drain electrode of a third transistor may be commonly connected to the capacitor and a drain electrode of the feedback field-effect transistor, and a gate electrode of the third transistor may be commonly connected to the gate electrode and the drain electrode of the second transistor.

According to one embodiment, the spike voltage may be determined by voltage division of the first transistor and the feedback field-effect transistor.

According to one embodiment, a period of the spike voltage may change depending on change in a voltage of the first word line.

According to one embodiment, a frequency of the spike voltage may change depending on change in a time width of an input pulse.

According to one embodiment, the single-gated feedback field-effect transistor may generate a spike voltage corresponding to the generated potential using a positive feedback loop phenomenon occurring in a channel region by a drain voltage.

According to one embodiment, a channel region of the single-gated feedback field-effect transistor may be provided with a plurality of potential barriers, and the single-gated feedback field-effect transistor may use the potential barriers to block injection of charge carriers before the drain voltage is applied.

According to one embodiment, when the drain voltage is increased to a predetermined reference voltage, the single-gated feedback field-effect transistor may induce, through the drain voltage, heights of the potential barriers in a valence band of a non-gated channel region to be lowered, and when heights of the potential barriers are lowered, the single-gated feedback field-effect transistor may operate to inject holes into potential wells of a gated channel region.

According to one embodiment, the single-gated feedback field-effect transistor may operate to inject holes into the potential wells of the gated channel region, and when heights of the potential barriers are lowered, the single-gated feedback field-effect transistor may operate to inject holes of the drain region into potential wells of a valence band of an intrinsic region.

According to one embodiment, as heights of the potential barriers are repeatedly lowered, the single-gated feedback field-effect transistor may operate to generate a positive feedback loop phenomenon, so that the potential barriers are eliminated only for a certain time.

According to one embodiment, the single-gated feedback field-effect transistor may reduce the spike voltage by inducing reset current to a voltage generated at a gate electrode of the second transistor, and may reset the generated spike voltage by causing discharge current to flow through the third transistor.

In accordance with another aspect of the present disclosure, provided is a neuron circuit, wherein the neuron circuit generates potential by charging current input from synapses through a capacitor; when the generated potential exceeds a threshold value, the neuron circuit generates and outputs spike current corresponding to the generated potential using a single-gated feedback field-effect transistor (FBFET) connected to the capacitor; and the neuron circuit resets the generated spike current using three transistors connected to the feedback field-effect transistor.

According to one embodiment, in the neuron circuit, by replacing the first transistor with a resistor, only a power supply voltage applied to a first word line that is a single-gated feedback field-effect transistor (FBFET) may be used; and a spike voltage may be determined by voltage division of the resistor replacing the first transistor and the feedback field-effect transistor.

BRIEF DESCRIPTION OF THE DRAWINGS

The above and other objects, features and other advantages of the present disclosure will be more clearly understood from the following detailed description taken in conjunction with the accompanying drawings, in which:

FIGS. 1A and 1B illustrate a feedback field-effect transistor according to one embodiment including a diode structure and an access electronic device connected to each other in series;

FIG. 1C illustrates the components of the diode structure in more detail;

FIG. 1D illustrates the components of the access electronic device in more detail;

FIG. 2 is a block diagram for explaining a neuron circuit according to one embodiment;

FIG. 3A is a graph for explaining the energy band diagram of an FBFET without drain bias;

FIG. 3B is a graph for explaining the energy band diagram of an FBFET depending on various drain voltages;

FIG. 3C is a graph for explaining an $I_D$-$V_D$ output curve at a $V_{GS}$ of 270 mV, hole concentration in the channel region of an FBFET, and electron concentration in the non-gated channel region of the FBFET depending on drain voltages;

FIG. 4A is a graph for explaining the spike mechanism of a neuron circuit having an energy band diagram according to $V_{mem}$;

FIG. 4B is a graph for explaining the reset operation of a neuron circuit using an energy band diagram depending on $V_{mem}$;

FIG. 4C is a diagram for explaining a neuron circuit operating in a current mode according to one embodiment;

FIG. 4D is a graph for explaining a simulated timing diagram of a neuron circuit according to one embodiment;

FIG. 5A shows an IF function for another input ($V_{WL1}$) simulated with an input pulse of 1.0 μs; and FIG. 5B shows a simulated timing diagram of a neuron circuit with various input pulse times.

DETAILED DESCRIPTION OF THE DISCLOSURE

Specific structural and functional descriptions of embodiments according to the concept of the present disclosure disclosed herein are merely illustrative for the purpose of explaining the embodiments according to the concept of the present disclosure. Furthermore, the embodiments according to the concept of the present disclosure can be implemented in various forms and the present disclosure is not limited to the embodiments described herein.

The embodiments according to the concept of the present disclosure may be implemented in various forms as various modifications may be made. The embodiments will be described in detail herein with reference to the drawings. However, it should be understood that the present disclosure is not limited to the embodiments according to the concept of the present disclosure, but includes changes, equivalents, or alternatives falling within the spirit and scope of the present disclosure.

The terms such as "first" and "second" are used herein merely to describe a variety of constituent elements, but the constituent elements are not limited by the terms. The terms are used only for the purpose of distinguishing one constituent element from another constituent element. For example, a first element may be termed a second element and a second element may be termed a first element without departing from the teachings of the present disclosure.

It should be understood that when an element is referred to as being "connected to" or "coupled to" another element, the element may be directly connected or coupled to the other element or intervening elements may be present. In contrast, when an element is referred to as being "directly connected to" or "directly coupled to" another element, there are no intervening elements present. Expressions describing relationships between components, such as "between", "immediately between", and "directly neighboring", should be interpreted as well.

The terms used in the present specification are used to explain a specific exemplary embodiment and not to limit the present inventive concept. Thus, the expression of singularity in the present specification includes the expression of plurality unless clearly specified otherwise in context. Also, terms such as "include" or "comprise" should be construed as denoting that a certain characteristic, number, step, operation, constituent element, component or a combination thereof exists and not as excluding the existence of or a possibility of an addition of one or more other characteristics, numbers, steps, operations, constituent elements, components or combinations thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, preferred embodiments of the present disclosure will be described in detail with reference to the accompanying drawings. However, the scope of the present disclosure is not limited by these embodiments. Like reference numerals in the drawings denote like elements.

FIGS. 1A and 1B illustrate a feedback field-effect transistor according to one embodiment including a diode structure 110 and an access electronic device 120 connected to each other in series.

Referring to FIG. 1A, a first drain region 114 of the diode structure 110 is connected to a bit line BL. Referring to FIG. 1B, a second source region 121 of the access electronic device 120 is connected to a source line SL. In addition, a first source region 111 of the diode structure 110 and a second drain region 123 of the access electronic device 120 may be connected to each other in series to form one device.

For example, the diode structure may be referred to as any one of a single-gated SiNW FBFET, a p-n-i-n transistor, a memory device, a semiconductor device, or a storage device.

Referring to FIG. 1A, the diode structure 110 may include the first source region 111, an intrinsic region 112, a gate region 113, and the first drain region 114, and a first gate electrode 115 may be formed in the intrinsic region 112.

According to one embodiment, the first gate electrode 115 may be disposed to surround the intrinsic region 112.

According to one embodiment, the first gate electrode 115 may be connected to a first word line $WL_1$ to receive a voltage.

For example, the access electronic device 120 shown in FIG. 1B may include the second source region 121, an intrinsic region 122, the second drain region 123, and a second gate electrode 124 disposed to surround the intrinsic region 122.

According to one embodiment, the first source region 111 of the diode structure 110 and the second drain region 123 of the access electronic device 120 may be connected to each other in series.

In addition, the second gate electrode 124 may be connected to a second word line $WL_2$.

According to one embodiment, depending on the magnitude of a voltage applied to the bit line BL, the first word line $WL_1$, and the second word line $WL_2$, the diode structure 110 may store any one of data in a first logic state or data in a second logic state.

In addition, the diode structure 110 may output current corresponding to stored data or maintain stored data without loss.

For example, data in a first logic state may represent "1", and data in a second logic state may represent "0". In addition, in the above description, data in a first logic state corresponds to "1", and data in a second logic state corresponds to "0", but such association may be flexibly changed depending on memory setting.

In addition, operation of storing data in a first logic state in the diode structure 110 as a memory may be referred to as programming.

In addition, operation of storing data in a second logic state in the diode structure 110 as a memory may be referred to as erasing.

In addition, the length of each region may be 50 nm. The doping concentration of the diode structure 110 may be $1 \times 10^{20}$ cm$^{-3}$ for a source, a drain, and an n$^+$-doped channel region.

The intrinsic region 112 is p-type doped at a doping concentration of $2 \times 10^{15}$ cm$^{-3}$. An access transistor may have a doping concentration of $1 \times 10^{20}$ cm$^{-3}$ or $1 \times 10^{17}$ cm$^{-3}$ for source/drain and channel regions, respectively.

One of the first and second gate electrodes 115 and 124 may be a platinum gate electrode. A platinum gate electrode (work function=5.65 eV) may be used for positive threshold values.

In addition, an aluminum electrode may be used as drain and source electrodes.

For example, the first and second word lines $WL_1$ and $WL_2$ may each be referred to as a control line.

According to the present disclosure, switching characteristics may be improved by connecting a p-n-i-n transistor and an access transistor in series, and may provide a low operating voltage.

In addition, according to the present disclosure, a limitation of sub-threshold voltage of conventional MOSFETs may be overcome by connecting a p-n-i-n transistor and an access transistor in series, thereby securing a high current sensing width.

FIG. 1C illustrates the components of the diode structure 110 in more detail.

Referring to FIG. 1C, the diode structure 110 may include the first source region 111, the first drain region 114, the intrinsic region 112 disposed between the first source region 111 and the first drain region 114, and the gate region 113 disposed between the intrinsic region 112 and the first drain region 114.

According to one embodiment, in the diode structure 110, the first gate electrode 115 may be disposed to surround the intrinsic region 112.

For example, the diode structure 110 may operate as a switch or volatile memory based on a drain voltage applied to the first drain region 114 and a gate voltage applied through the first gate electrode 115 and a second gate electrode (not shown). In this case, the second gate electrode may be disposed in the access electronic device.

According to one embodiment, the diode structure 110 may have a channel length ($L_{CH}$) of 100 nm and a channel diameter of 10 nm, and the thickness of a gate oxide may be 2 nm.

According to one embodiment, the diode structure 110 may operate as an n-channel semiconductor device and may exhibit characteristics similar to the n-channel device of a MOSFET except for hysteresis characteristics.

According to one embodiment, the diode structure 110 may be formed vertically or horizontally on a substrate, the substrate may be a single crystal silicon substrate, and the diode structure 110 may be silicon in a polycrystalline state or a single crystal state.

According to another embodiment, the diode structure 110 may be doped with a first or second conductivity type depending on a vertical position on a substrate.

Here, the first conductivity type may be n-type, and second conductivity type may be p-type.

For example, the first gate electrode 115 may be disposed to surround the intrinsic region 112.

For example, the diode structure 110 may exhibit a $p^+$-$n^+$-i-$n^+$ structure and may include a first p-n junction, a second p-n junction, and a third p-n junction.

Here, $p^+$ may represent a case wherein doping is performed with a high concentration of a p-type impurity, and $n^+$ may represent a case wherein doping is performed with a high concentration of an n-type impurity.

For example, an n-channel may represent a case wherein both sides of the diode structure 110 with respect to the intrinsic region 112 are doped with an n-type impurity.

In addition, a p-channel may represent a case wherein both sides of the diode structure 110 with respect to the intrinsic region 112 are doped with a p-type impurity.

Therefore, the present disclosure may implement a feedback field-effect transistor capable of performing a high-speed memory operation by connecting a p-n-i-n transistor and an access transistor in series without increasing leakage current.

In addition, according to the present disclosure, by connecting a p-n-i-n transistor and an access transistor in series, switching characteristics may be improved, and a low operating voltage may be realized.

According to one embodiment, when a gate voltage is received through first and second word lines, the diode structure 110 may store data based on the magnitude of a bit-line voltage.

That is, when a gate voltage is received through first and second word lines and the magnitude of a bit-line voltage is greater than that of a reference voltage, the diode structure 110 may store data in a first logic state.

In addition, when a bit-line voltage is less than a reference voltage, the diode structure 110 may store data in a second logic state.

In this case, the reference voltage may correspond to a voltage of 1.2 V.

For example, when a gate voltage is not applied through first and second word lines and a bit-line voltage is greater than a reference voltage, the diode structure 110 may maintain stored data in advance.

In addition, when the first gate voltage of a first word line is greater than a first threshold voltage, the diode structure 110 may recognize the first gate voltage as a first state. For example, the first threshold voltage may correspond to a voltage of about 0.6 V.

According to one embodiment, when the second gate voltage of a second word line is greater than a second threshold voltage, the diode structure 110 may recognize the second gate voltage as a first state. For example, the second threshold voltage may correspond to a voltage of about 1 V.

For example, a first state may be a state corresponding to '1' on a logic circuit, and a second state may be a state corresponding to '0' on a logic circuit.

According to one embodiment, when a gate voltage is applied through only the second word line among first and second word lines and a bit-line voltage is greater than a reference voltage, the diode structure 110 may output current to a source line through a second source region.

For example, the operation of the diode structure 110 outputting current through a source line may correspond to a read operation.

FIG. 1D illustrates the components of the access electronic device 120 in more detail.

Referring to FIG. 1D, the access electronic device 120 may include the second source region 121, the intrinsic region 122, the second drain region 123, and the second gate electrode 124 disposed to surround the intrinsic region 122. For example, the access electronic device 120 may be referred to as an access transistor or an n-channel SiNW MOSFET transistor.

According to one embodiment of the present disclosure, in the access electronic device 120, the second source region 121 and the second drain region 123 may be doped with an n-type impurity, and the intrinsic region may be doped with a p-type impurity.

For example, p may represent a case wherein doping is performed with a low concentration of a p-type impurity, and $n^+$ may represent a case wherein doping is performed with a high concentration of an n-type impurity.

FIG. 2 is a block diagram for explaining a neuron circuit according to one embodiment.

The present disclosure provides a neuron circuit capable of performing an integrate-and-fire function using only four transistors including a feedback field-effect transistor and MOSFETs.

In particular, the positive feedback loop of a feedback field-effect transistor plays a major role in a neuron circuit that implements an integrate-and-fire function. A neuron circuit according to one embodiment may use the positive feedback loop of a feedback field-effect transistor to integrate input pulses, generate spikes, and provide a reset operation.

FIG. 2 shows a proposed integrate-and-fire (IF) neuron circuit with a basic neuromorphic block consisting of two synapse devices 210 and 220 and a neuron circuit implementing a hardware-based SNN.

A neuron circuit 200 according to one embodiment consists of a single-gated feedback field-effect transistor (FB-FET), three MOSFETs M1 to M3, and a capacitor $C_{mem}$ for an integration operation.

The pre-synapses 210 receive synapse outputs from neuronal cells to which the pre-synapses 210 are connected, and convert the synapse outputs into current inputs that reflect the weight of a synapse.

Synapse current inputs may be integrated by charging the capacitor of the neuron circuit 200 and generating potential.

In addition, when potential being charged reaches a threshold value, the neuron circuit 200 according to one embodiment may generate an output spike 201.

As shown in FIG. 2, the output spike of the neuron circuit 200 may be transmitted to post-synapses 220.

Operation of each device of the neuron circuit 200 will be described in detail with reference to FIGS. 4A and 4B.

FIG. 3A is a graph for explaining an energy band diagram 310 of a feedback field-effect transistor without drain bias.

The feedback field-effect transistor for implementing a neuron circuit operates based on a positive feedback loop phenomenon occurring in a channel region by a drain voltage.

The energy band diagram 310 of FIG. 3A is an energy band diagram of the feedback field-effect transistor under a condition that a gate-to-source voltage ($V_{GS}$) is 270 mV and under a drain bias condition.

An applied positive gate voltage may accelerate the positive feedback loop of the feedback field-effect transistor at a lower drain voltage. For this purpose, before a drain voltage is applied, as shown in FIG. 3A, the channel region of the feedback field-effect transistor is provided with two potential barriers to block injection of charge carriers.

When the drain voltage of the neuron circuit according to one embodiment is increased from 0.0 V to 1.5 V, potential barriers may be lowered in the valence band of a non-gated channel region, and holes may be injected into potential wells in a gated channel region.

A drain voltage may induce lowering of potential barriers in the valence band of a non-gated channel region. In addition, as the potential barrier is lowered, holes in a drain region may be injected into potential wells in the valence band of an intrinsic region.

As a result, holes integrated in the potential wells may electrically lower the heights of potential barriers at the conduction band of a gated channel region.

In the same way, integrated electrons may lower the heights of potential barriers at the conduction band of a non-gated channel region.

FIG. 3B is a graph for explaining an energy band diagram 320 of a feedback field-effect transistor according to change in a drain voltage.

As can be seen in the energy band diagram 320 shown in FIG. 3B, when the height of a barrier is repeatedly lowered, a positive feedback loop occurs, and eventually the potential barrier disappears within a very short time.

Accordingly, at a drain voltage ($V_D$) of 1.4 V, the positive feedback loop of the feedback field-effect transistor is induced and, as shown in FIG. 3C, drain current is sharply increased.

FIG. 3C is a graph for explaining an $I_{DS}$-$V_{DS}$ output curve at a gate-to-source voltage ($V_{GS}$) of 270 mV and hole concentration in the channel region of a feedback field-effect transistor depending on drain voltages. In particular, the hole concentration of a gated channel region is increased from $1\times10^{18}$ cm$^{-3}$ to $5\times10^{19}$ cm$^{-3}$.

FIG. 4A is a graph for explaining the spike mechanism of a neuron circuit 410 having an energy band diagram according to $V_{mem}$.

FIGS. 4A and 4B show the spike and reset mechanisms of the neuron circuit 410 that includes various energy band diagrams of a feedback field-effect transistor.

The neuron circuit 410 may generate potential by charging current input from synapses in a capacitor 411. In addition, when the generated potential exceeds a threshold value, the neuron circuit 410 may generate and output a spike voltage corresponding to the generated potential using the single-gated feedback field-effect transistor 412 connected to the capacitor 411. In addition, the neuron circuit 410 may reset the generated spike voltage using transistors 413, 414, and 415 connected to the feedback field-effect transistor.

In the single-gated feedback field-effect transistor 412, a drain electrode may be connected in parallel to the capacitor 411, a source electrode may be connected to the three transistors 413, 414, and 415, and a gate electrode may be connected to the first word line $WL_1$.

The connection relationship between the transistors 413, 414, and 415 is as follows. First, the gate electrode of the first transistor 413 (M1) may be connected to the second word line $WL_2$, and the drain electrode of the first transistor 413 (M1) may be connected in series to the source electrode of the feedback field-effect transistor 412.

In addition, the gate electrode and the drain electrode of the second transistor 414 (M2) may be commonly connected to the drain electrode of the first transistor 413 (M1) and the source electrode of the feedback field-effect transistor 412.

In addition, the drain electrode of the third transistor 415 (M3) may be commonly connected to the capacitor 411 and the drain electrode of the feedback field-effect transistor 412, and the gate electrode of the third transistor 415 (M3) may be commonly connected to the gate electrode and the drain electrode of the second transistor 414 (M2).

In addition, the voltage of the drain electrode of the feedback field-effect transistor 412 may be defined as $V_{mem}$, and the threshold value of the drain electrode or the threshold value of $V_{mem}$ is a voltage for spike and reset operations.

The voltages of the first and second word lines $WL_1$ and $WL_2$ may be determined with respect to an appropriate threshold value and spike voltage of an output voltage ($V_{spike}$).

These voltages may change the characteristics of a neuron circuit, such as threshold values for triggering and spike frequencies.

When a constant voltage (e.g., $V_{WL1}$=270 mV, $V_{WL2}$=450 mV) is applied to the first and second word lines $WL_1$ and $WL_2$, an integrate-and-fire operation may be realized through increase in $V_{mem}$ by a synapse current input ($I_{synaptic}$).

When a current input pulse ($I_{synaptic}$) is applied to the neuron circuit 410, a sum of input current may increase $V_{mem}$ potential in the capacitor 411 while being integrated.

Accordingly, each time a current input pulse ($I_{synaptic}$) is applied, $V_{mem}$ gradually increases as shown in Drawing Symbol 416 of FIG. 4A.

When $V_{mem}$ exceeds a threshold value for generating a feedback loop, $V_{spike}$ suddenly increases when a spike occurs. A spike voltage may be determined by the voltage division of the feedback field-effect transistor 412 and the first transistor 413 (M1).

For example, the neuron circuit 410 may replace the first transistor 413 (M1) with a resistor, and may use only a power supply voltage applied to the first word line $WL_1$, which is a single-gated feedback field-effect transistor (FB-FET), and a spike voltage may be determined by the voltage division of the replaced resistor and the feedback field-effect transistor.

FIG. 4B is a graph for explaining the reset operation of a neuron circuit using an energy band diagram depending on $V_{spike}$.

In a neuron circuit 420 shown in FIG. 4B, by reducing $V_{spike}$ as a reset operation, the potential barrier of a feedback field-effect transistor 422 in which a positive feedback loop is eliminated is generated.

Then, when $V_{spike}$ is increased in a short time, the gate voltage of a second transistor 424 (M2) may induce reset current ($I_{reset}$). In addition, $V_{spike}$ may be reduced according to the induced reset current ($I_{reset}$).

In spike and reset functions, a first transistor 423 (M1) operates as a variable resistor, the feedback field-effect transistor 422 generates $V_{spike}$, and the second transistor 424 (M2) and a third transistor 425 (M3) are responsible for spiking and reset of $V_{mem}$, respectively.

An energy band diagram of the feedback field-effect transistor 422 during spiking and reset is shown in Drawing Symbol 420.

A first word line voltage ($V_{WL1}$) and a second word line voltage ($V_{WL2}$) may be determined with respect to threshold values and $V_{spike}$.

By adjusting a first word line voltage ($V_{WL1}$) and a second word line voltage ($V_{WL2}$), threshold values for triggering of the neuron circuit 420, $V_{spike}$, and fire frequencies may be changed.

When a first word line voltage ($V_{WL1}$) is 270 mV and a second word line voltage ($V_{WL2}$) is 450 mV, and when $I_{synaptic}$ flows through the neuron circuit, electric charges carried by $I_{synaptic}$ may be integrated into $C_{mem}$, increasing $V_{mem}$.

When $V_{mem}$ reaches a threshold value of 1.5 V for generation of a positive feedback loop, $V_{spike}$ is suddenly generated, and this voltage value may be determined by the voltage division of the feedback field-effect transistor 422 and the first transistor 423 (M1). In addition, a positive feedback loop may be generated, which allows the neuron circuit to generate $V_{spike}$.

As a result, fire of $V_{spike}$ may rapidly increase the gate voltages of the second transistor 424 (M2) and the third transistor 425 (M3), allowing a channel to open.

Flow of $I_{reset}$ in the channel of the second transistor 424 (M2) and flow of $I_{out}$ in the channel of the third transistor 425 (M3) may dramatically reduce $V_{spike}$ and $V_{mem}$, respectively.

That is, fire of $V_{spike}$ may quickly reduce $V_{mem}$ to less than 1.5 V, eliminating a positive feedback loop.

As a result, the neuron circuit 420 is immediately reset to an initial state where $V_{mem}$ is 0.0V, and $V_{spike}$ generated by the neuron circuit is transmitted to post-synapses.

Accordingly, as shown in an energy band diagram 426, the $V_{mem}$ of a charged feedback field-effect transistor may gradually decrease while being discharged.

After the reset operation, each time synapse input current $I_{synaptic}$ flows through the neuron circuit 420, an operation of integrate-and-fire is repeated.

FIG. 4C is a diagram for explaining a neuron circuit operating in a current mode according to one embodiment.

A neuron circuit 430 may generate potential by charging current input from synapses in a capacitor 431. In addition, when generated potential exceeds a threshold value, the neuron circuit 430 may generate and output ($I_{reset}$) spike current corresponding to the generated potential using a single-gated feedback field-effect transistor 432 connected to the capacitor 431. In addition, the neuron circuit 430 may reset the generated spike current using transistors 433, 434, and 435 connected to the feedback field-effect transistor.

The single-gated feedback field-effect transistor 432 may be implemented to have a structure in which a drain electrode is connected in parallel to the capacitor 431 and a source electrode is connected to the three transistors 433, 434, and 435.

The connection relationship between the transistors 433, 434, and 435 is as follows. First, the gate electrode of the first transistor 433 (M1) may be connected to the second word line $WL_2$, and the drain electrode of the first transistor 433 (M1) may be connected in series to the source electrode of the feedback field-effect transistor 432.

In addition, the gate electrode and the drain electrode of the second transistor 434 (M2) may be commonly connected to the drain electrode of the first transistor 433 (M1) and the source electrode of the feedback field-effect transistor 432.

In addition, the drain electrode of the third transistor 435 (M3) may be commonly connected to the capacitor 411 and the drain electrode of the feedback field-effect transistor 432, and the gate electrode of the third transistor 435 (M3) may be commonly connected to the gate electrode and the drain electrode of the second transistor 434 (M2).

FIG. 4D is a graph for explaining a simulated timing diagram 440 of a neuron circuit according to one embodiment.

The neuron circuit may require a series of initialization operations in a feedback field-effect transistor for an IF operation. After the initialization operation of the neuron circuit, an input current pulse ($I_{synaptic}$) of 10 μA is applied to the neuron circuit for 1 μs with a period of 10 μs. Each time an input pulse 441 is applied, $V_{mem}$ 442 is increased by 0.3 $V_{mem}$ When the input pulse 441 is applied five times, the $V_{mem}$ 442 may exceed a threshold value.

When the threshold value is exceeded, an output spike pulse ($V_{spike}$) of 0.0 V to 0.6 V is generated.

When reset is completed, $V_{spike}$ and $V_{mem}$ may return to an initial value ($V_{spike}=V_{mem}=0.0$ V) to repeat an IF operation. Thereafter, the next repeated synapse input pulse may increase $V_{mem}$ again, and, and this cycle of the integrate-and-fire operation normally occurs as shown in FIG. 4D.

As a result, the neuron circuit according to one embodiment of the present disclosure may exhibit an IF operation of about 20 kHz fire frequency using only four transistors.

In terms of the number of transistors used, device type, type of synapse input, power consumption, and fire frequency, the performance of the neuron circuit according to the present disclosure is superior to that of conventional neuron circuits.

Among conventional neuron circuits, conductance-based neuron circuits and neuron circuits using a Hindmarsh-Rose model seem to consume the highest power at low fire frequency using many transistors. In addition, in the case of CMOS-based neuron circuits, the Izhikevich model with excellent fire frequency requires 14 transistors and high power consumption of 40 μW. In addition, other conventional neuron circuits require more than 20 transistors.

In particular, conventional neuron circuits using a single-gated feedback field-effect transistor have a good fire frequency due to the characteristics of a feedback field-effect transistor, but require nine transistors, one resistor, and one capacitor.

In conclusion, the neuron circuit of the present disclosure has a small circuit area and is the simplest in terms of power consumption and fire frequency. In addition, the neuron circuit of the present disclosure is the most efficient circuit.

In particular, in the neuron circuit of the present disclosure, the feedback field-effect transistor of the gate circuit maintains a constant voltage of 270 mV. Thus, the gate electrode of the feedback field-effect transistor may be replaced by an additional doping process in the gated channel region.

FIG. 5A is a drawing 510 showing an IF function for another input ($V_{WL1}$) simulated with an input pulse of 1.0 μs.

No special bias system is required for operation of the neuron circuit of the present disclosure. Simulation results using the single-gated feedback field-effect transistor show the possibility of the neuron circuit for two-terminal feedback field-effect transistors.

To investigate dependence of an IF operation on input voltages and pulse widths in the neuron circuit of the present disclosure, simulation was performed on the first word line $WL_1$ at voltages of 260 mV and 280 mV and input pulse widths of 0.5 μs and 1.5 μs. As shown in Drawing Symbol 510, change in the voltage and input pulse width of the first word line $WL_1$ affects fire frequencies and threshold values for triggering and spikes.

More specifically, FIG. 5A shows a simulated timing diagram for various voltages of the first word line $WL_1$.

First, Drawing Symbol 511 shows change in $V_{mem}$ when the voltage of the first word line $WL_1$ is 260 mV, and Drawing Symbol 512 shows outputs ($V_{spike}$) in an environment of Drawing Symbol 511.

In addition, Drawing Symbol 513 shows change in a threshold voltage ($V_{mem}$) when the voltage of the first word line $WL_1$ is 280 mV, and Drawing Symbol 514 shows outputs ($V_{spike}$) in an environment of Drawing Symbol 513.

Positive $V_{WL1}$ may induce a positive feedback loop in a feedback field-effect transistor by lowering potential barriers in a gated channel region. Accordingly, threshold values for triggering and spikes may be lowered by the magnitude of the voltage of the first word line $WL_1$ corresponding to the characteristics of a common feedback field-effect transistor. Accordingly, the first word line voltage ($V_{WL1}$) may be quickly increased exceeding a threshold voltage in a neuron circuit and thus generating spikes and reset.

As the voltage of the first word line $WL_1$ is increased from 260 mV to 280 mV, the threshold value of $V_{mem}$ is reduced from 1.8 V to 1.5 V, but a fire frequency is gradually increased from 14.7 kHz to 21.3 kHz. The first word line voltage ($V_{WL1}$) controls the threshold value ($V_{mem}$) and fire frequency of a neuron circuit.

FIG. 5B shows a simulated timing diagram of a neuron circuit with various input pulse times.

In addition, in FIG. 5B, since the sum of input current is integrated in a capacitor to increase the potential of a threshold voltage, the sum of input pulses is considered important in an integration operation. As an input pulse width increases from 0.5 μs shown in Drawing Symbol 521 to 1.5 μs shown in Drawing Symbol 523, as shown in FIG. 5B, a fire frequency of reaching a threshold voltage (fire) increases from 6.3 kHz shown in Drawing Symbol 522 to 28.5 kHz shown in Drawing Symbol 524.

As a result, the present disclosure may provide a novel integrate-and-fire (IF) neuron circuit using a single-gated feedback field-effect transistor to realize small size and low power consumption.

According to one embodiment, the present disclosure may provide an integrate-and-fire (IF) neuron circuit capable of implementing a high fire frequency of 20 kHz and a low power consumption of 7 μW using only four transistors.

According to one embodiment, the present disclosure may provide a possibility of realizing a hardware-based SNN for very-large-scale integration (VLSI).

According to one embodiment, the present disclosure can provide a novel integrate-and-fire (IF) neuron circuit using a single-gated feedback field-effect transistor (FBFET) to realize small size and low power consumption.

According to one embodiment, the present disclosure can provide an integrate-and-fire (IF) neuron circuit capable of implementing a high fire frequency of 20 kHz and a low power consumption of 7 μW using only four transistors.

According to one embodiment, the present disclosure can provide a possibility of realizing a hardware-based SNN for very-large-scale integration (VLSI).

The apparatus described above may be implemented as a hardware component, a software component, and/or a combination of hardware components and software components. For example, the apparatus and components described in the embodiments may be achieved using one or more general purpose or special purpose computers, such as, for example, a processor, a controller, an arithmetic logic unit (ALU), a digital signal processor, a microcomputer, a field programmable gate array (FPGA), a programmable logic unit (PLU), a microprocessor, or any other device capable of executing and responding to instructions. The processing device may execute an operating system (OS) and one or more software applications executing on the operating system. In addition, the processing device may access, store, manipulate, process, and generate data in response to execution of the software. For ease of understanding, the processing apparatus may be described as being used singly, but those skilled in the art will recognize that the processing apparatus may include a plurality of processing elements and/or a plurality of types of processing elements. For example, the processing apparatus may include a plurality of processors or one processor and one controller. Other processing configurations, such as a parallel processor, are also possible.

The software may include computer programs, code, instructions, or a combination of one or more of the foregoing, configure the processing apparatus to operate as desired, or command the processing apparatus, either independently or collectively. In order to be interpreted by a processing device or to provide instructions or data to a processing device, the software and/or data may be embodied permanently or temporarily in any type of a machine, a component, a physical device, a virtual device, a computer storage medium or device, or a transmission signal wave. The software may be distributed over a networked computer system and stored or executed in a distributed manner. The software and data may be stored in one or more computer-readable recording media.

Although the present disclosure has been described with reference to limited embodiments and drawings, it should be understood by those skilled in the art that various changes and modifications may be made therein. For example, the described techniques may be performed in a different order than the described methods, and/or components of the described systems, structures, devices, circuits, etc., may be combined in a manner that is different from the described method, or appropriate results may be achieved even if replaced by other components or equivalents.

Therefore, other embodiments, other examples, and equivalents to the claims are within the scope of the following claims.

DESCRIPTION OF SYMBOLS

110: DIODE STRUCTURE
111: FIRST SOURCE REGION
112: INTRINSIC REGION
113: GATE REGION
114: FIRST DRAIN REGION
115: FIRST GATE ELECTRODE
120: ACCESS ELECTRONIC DEVICE
121: SECOND SOURCE REGION
122: INTRINSIC REGION
123: SECOND DRAIN REGION
124: SECOND GATE ELECTRODE

What is claimed is:

1. A neuron circuit, wherein the neuron circuit generates potential by charging current input from synapses through a capacitor;
when the generated potential exceeds a threshold value, the neuron circuit generates and outputs a spike voltage corresponding to the generated potential using a single-gated feedback field-effect transistor (FBFET) connected to the capacitor; and
the neuron circuit resets the generated spike voltage using three transistors connected to the single-gated feedback field-effect transistor,
wherein a drain electrode of the single-gated feedback field-effect transistor is connected in parallel to the capacitor, a source electrode of the single-gated feedback field-effect transistor is connected to the three transistors, and a bate electrode of the single-gated feedback field-effect transistor is connected to a first word line.

2. The neuron circuit according to claim 1, wherein, among the three transistors, a gate electrode of a first transistor is connected to a second word line, and a drain electrode of the first transistor is connected in series to a source electrode of the single-gated feedback field-effect transistor;
a gate electrode and drain electrode of a second transistor are commonly connected to the drain electrode of the first transistor and the source electrode of the single-gated feedback field-effect transistor; and
a drain electrode of a third transistor is commonly connected to the capacitor and a drain electrode of the single-gated feedback field-effect transistor, and a gate electrode of the third transistor is commonly connected to the gate electrode and the drain electrode of the second transistor.

3. The neuron circuit according to claim 2, wherein the spike voltage is determined by voltage division of the first transistor and the single-gated feedback field-effect transistor.

4. The neuron circuit according to claim 2, wherein a period of the spike voltage changes depending on change in a voltage of the first word line.

5. The neuron circuit according to claim 2, wherein a frequency of the spike voltage changes depending on change in a time width of an input pulse.

6. The neuron circuit according to claim 2, wherein the single-gated feedback field-effect transistor reduces the spike voltage by inducing reset current to a voltage generated at a gate electrode of the second transistor, and resets the generated spike voltage by causing discharge current to flow through the third transistor.

7. The neuron circuit according to claim 2, wherein, in the neuron circuit, by replacing the first transistor with a resistor, only a power supply voltage applied to a first word line that is a single-gated feedback field-effect transistor (FBFET) is used; and
a spike voltage is determined by voltage division of the resistor replacing the first transistor and the single-gated feedback field-effect transistor.

8. A neuron circuit, wherein the neuron circuit generates potential by charging current input from synapses through a capacitor;
when the generated potential exceeds a threshold value, the neuron circuit generates and outputs a spike voltage corresponding to the generated potential using a single-gated feedback field-effect transistor (FBFET) connected to the capacitor; and
the neuron circuit resets the generated spike voltage using three transistors connected to the single-gated feedback field-effect transistor,
wherein the single-gated feedback field-effect transistor generates a spike voltage corresponding to the generated potential using a positive feedback loop phenomenon occurring in a channel region by a drain voltage.

9. The neuron circuit according to claim 8, wherein a channel region of the single-gated feedback field-effect transistor is provided with a plurality of potential barriers, and the single-gated feedback field-effect transistor uses the potential barriers to block injection of charge carriers before the drain voltage is applied.

10. The neuron circuit according to claim 9, wherein, when the drain voltage is increased to a predetermined reference voltage, the single-gated feedback field-effect transistor induces, through the drain voltage, heights of the potential barriers in a valence band of a non-gated channel region to be lowered, and when heights of the potential barriers are lowered, the single-gated feedback field-effect transistor operates to inject holes into potential wells of a gated channel region.

11. The neuron circuit according to claim 10, wherein the single-gated feedback field-effect transistor operates to inject holes into the potential wells of the gated channel region, and when heights of the potential barriers are lowered, the single-gated feedback field-effect transistor operates to inject holes of the drain region into potential wells of a valence band of an intrinsic region.

12. The neuron circuit according to claim 11, wherein, as heights of the potential barriers are repeatedly lowered, the single-gated feedback field-effect transistor operates to generate a positive feedback loop phenomenon, so that the potential barriers are eliminated only for a certain time.

13. A neuron circuit, wherein the neuron circuit generates potential by charging current input from synapses through a capacitor;
when the generated potential exceeds a threshold value, the neuron circuit generates and outputs spike current corresponding to the generated potential using a single-gated feedback field-effect transistor (FBFET) connected to the capacitor; and
the neuron circuit resets the generated spike current using three transistors connected to the single-gated feedback field-effect transistor,
wherein a drain electrode of the single-gated feedback field-effect transistor is connected in parallel to the capacitor, a source electrode of the single-gated feedback field-effect transistor is connected to the three transistors, and a gate electrode of the single-gated feedback field-effect transistor is connected to a first word line.

* * * * *